(12) United States Patent
Abhishek et al.

(10) Patent No.: US 10,205,441 B1
(45) Date of Patent: Feb. 12, 2019

(54) LEVEL SHIFTER HAVING CONSTANT DUTY CYCLE ACROSS PROCESS, VOLTAGE, AND TEMPERATURE VARIATIONS

(71) Applicant: NXP USA, INC., Austin, TX (US)

(72) Inventors: Kumar Abhishek, Bee Cave, TX (US); Srikanth Jagannathan, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/842,293

(22) Filed: Dec. 14, 2017

(51) Int. Cl.
*H03K 5/003* (2006.01)
*H03K 19/003* (2006.01)
*H03K 3/356* (2006.01)

(52) U.S. Cl.
CPC ......... *H03K 5/003* (2013.01); *H03K 3/35613* (2013.01); *H03K 19/00315* (2013.01)

(58) Field of Classification Search
None
See application file for complete search history.

(56) References Cited

U.S. PATENT DOCUMENTS

| | | | | |
|---|---|---|---|---|
| 6,556,061 B1* | 4/2003 | Chen | ............... | H03K 3/356113 327/333 |
| 6,700,407 B1* | 3/2004 | Wert | ............... | H03K 3/356113 326/62 |
| 7,193,441 B2* | 3/2007 | Chen | ............... | H03K 19/00315 326/81 |
| 7,365,569 B1* | 4/2008 | Venugopal | ......... | H03K 3/35613 326/68 |
| 7,468,615 B1* | 12/2008 | Tan | ............... | H03K 19/00315 326/68 |
| 7,609,090 B2 | 10/2009 | Srivastava et al. | | |
| 9,112,511 B2* | 8/2015 | Lnu | ............... | H03K 3/356182 |
| 2008/0186075 A1 | 8/2008 | Kim et al. | | |
| 2011/0050310 A1 | 3/2011 | Storms | | |

* cited by examiner

*Primary Examiner* — Minh D A
*Assistant Examiner* — James H Cho
(74) *Attorney, Agent, or Firm* — Daniel D. Hill (57) ABSTRACT

A level shifter includes a level shifting circuit, a variable bias voltage generator, and a bias voltage generator controller. The level shifting circuit is configured to level shift an input signal at a first voltage level to an output signal having a second voltage level. The second voltage level is higher than the first voltage level. The level shifting circuit includes a current mirror, an input circuit for receiving the differential input signals, and a coupling circuit for coupling the current mirror to the input circuit in response to a variable bias voltage. The variable bias voltage generator is configured to provide the variable bias voltage at one of a plurality of voltage levels. The bias voltage generator controller provides a select signal to select the voltage level from the plurality of voltage levels in response to measuring the duty cycle of the output signal to maintain the duty cycle of the output signal at a predetermined duty cycle.

19 Claims, 4 Drawing Sheets

LEVEL SHIFTER HAVING CONSTANT DUTY CYCLE ACROSS PROCESS, VOLTAGE, AND TEMPERATURE VARIATIONS

BACKGROUND

Field

This disclosure relates generally to level shifters, and more particularly, to a level shifter having a relatively constant duty cycle across process, voltage, and temperature (PVT) variations.

Related Art

Levels shifters are used in integrated circuits in which there is a transition from a first voltage level to second voltage level, where the second voltage level can be higher or lower than the first voltage level. For example, there may be a need to drive a digital logic one at an output terminal with a logic high voltage level that is higher than the internal logic high voltage level of the circuit that generated the digital logic one. However, in a level shifter, there may be a problem exposing the gate oxide of some integrated circuit transistor types to higher voltage levels that can cause damage to the transistors. Some process technologies allow for transistors to have different gate oxide thicknesses so that the transistors in a level shifter that are required to withstand higher voltage levels are implemented with a thicker gate oxide. However, the use of a thicker gate oxide may change some of the transistor characteristics that are detrimental to circuit operation.

Figure 1:
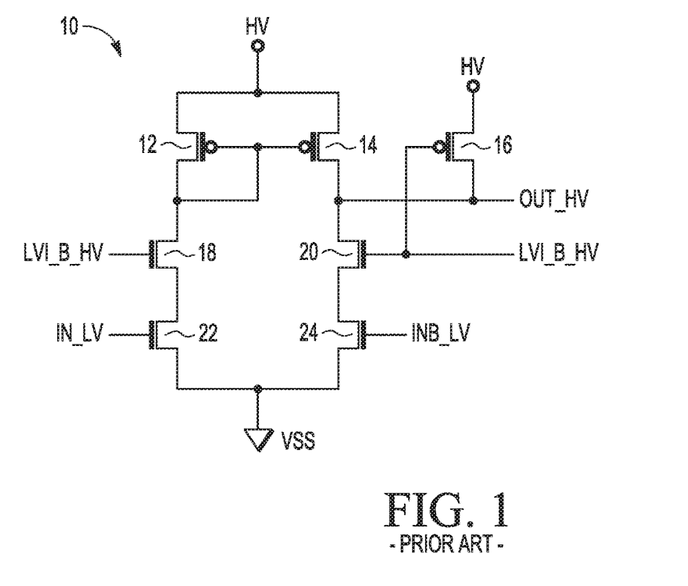
FIG. 1 illustrates, in schematic diagram form, a level shifter in accordance with the prior art.

FIG. 1 illustrates a level shifter 10 in accordance with the prior art. Level shifter 10 includes P-channel transistors 12, 14, and 16 and N-channel transistors 18, 20, 22, and 24. Level shifter 10 receives a power supply voltage at a high voltage level labeled HV. Level shifter 10 translates signals generated at a lower internally generated power supply voltage level LV to the higher voltage level HV. Transistors 22 and 24 receive differential input signals IN_LV and INB_LV, where input signal INB_LV is a logical complement of input signal IN_LV, and the input signals are generated at the lower voltage level LV. Transistors 12 and 14 are coupled together to function as a current mirror. Transistors 18 and 20 receive a control signal labeled LVI_B_HV that is provided to ensure that input signals IN_LV and INV_LV are ignored when LVI_B_HV is a logic zero, or a low voltage level, by turning off transistors 18 and 20. The logic low signal LVI_B_HV may be used to indicate that the input signal at the LV voltage level is below the normal operating level. The logic zero LVI_B_HV also causes transistor 16 to pull the output OUT_HV high so that a known logic state, e.g. a logic one, is provided during power up. Note that signal names ending with HV indicate that the signals are higher voltage signals generated at the higher power supply voltage HV, and signal names ending with LV are signals generated at the lower internal power supply voltage LV.

All of the transistors in level shifter 10 are formed using a relatively thicker gate oxide. The thicker gate oxide makes the transistors more resistant to damage caused by exposure to potentially damaging higher voltage levels. Transistors with the thicker gate oxide are illustrated in the drawings using a thicker line to represent the transistor's gate electrode. Because transistors 22 and 24 are implemented using the thicker gate oxide but receive a lower input voltage, the transistors need to be relatively large, i.e., have a relatively larger surface area on an integrated circuit (IC) than if the transistors were implemented using a thinner gate oxide. Also, the thicker gate oxide may change some of the operating characteristics, such as threshold voltage, and thus change how level shifter 10 functions at the lower input voltage. Therefore, level shifter 10 may not work at some PVT corners and the duty cycle of the output signal may change with PVT changes. Also, level shifter 10 is less efficient because of the larger surface area required to implement it.

Figure 2:
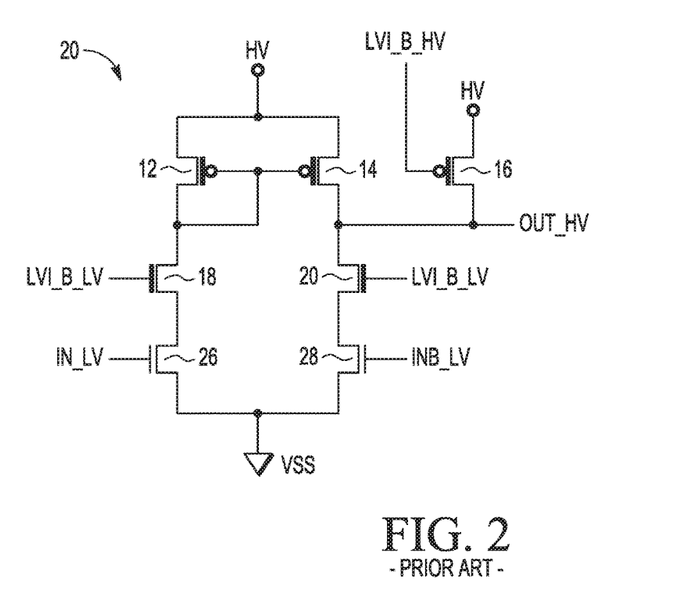
FIG. 2 illustrates, in schematic diagram form, another level shifter in accordance with the prior art.

FIG. 2 illustrates a level shifter 20 in accordance with the prior art. Level shifter 20 is the same as level shifter 10 except that level shifter 20 includes N-channel transistors 26 and 28 instead of transistors 22 and 24. N-channel transistors 26 and 28 are implemented using a thinner oxide than transistors 22 and 24, which is shown in FIG. 2 by the use of a thinner line to represent the gate electrodes. The thinner gate oxide transistors 26 and 28 have higher drive capability at lower voltage input signals IN_LV and INB_LV than the thicker gate oxide transistors 22 and 24, allowing transistors 26 and 28 to require smaller surface area of the IC. However, transistors 26 and 28 may be overstressed by exposure to the higher voltage HV, so thicker gate oxide transistors 18 and 20 are biased using lower voltage level signals LVI_B_LV to lower a source electrode voltage of transistors 18 and 20. This causes loss of drive capability in transistors 18 and 20 while protecting transistors 26 and 28 from overstress. The loss of drive capability can affect the duty cycle of output signal OUT_HV because the output signal cannot be pulled low as quickly or respond to PVT changes.

Therefore, a need exists for a level shifter that ensures a relatively constant duty cycle across PVT variations while still providing efficient use of IC surface area and good drive capability.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Generally, there is provided, a level shifter having a relatively constant duty cycle across process, voltage, and temperature variations. The level shifter translates a signal generated at a lower voltage LV to a signal having a higher voltage HV. The level shifter includes a current mirror circuit coupled to the higher voltage HV, input transistors coupled to receive differential input signals generated at the lower voltage LV, and coupling transistors. A coupling transistor is coupled in series between the current mirror and an input transistor. The coupling transistors are coupled to receive a variable bias voltage from a bias voltage generator configured to provide multiple bias voltages. The variable bias voltage generator is controlled by a digital controller coupled to measure the duty cycle of the output signal of the level shifter. In response to measuring the duty cycle, a control signal for selecting one of the multiple bias voltages is provided to the variable bias voltage generator. The selected one of the multiple bias voltages provides the bias for the coupling transistors so that the duty cycle is maintained at a predetermined level, such as for example, a fifty percent (50%) duty cycle. In this manner, the predetermined duty cycle is maintained for PVT variations during operation while providing an efficient implementation.

In accordance with an embodiment, there is provided, a level shifter including: first and second load transistors, each of the first and second load transistors having a first current electrode coupled to receive a first power supply voltage, and each of the first and second load transistors having a second current electrode, wherein an output signal of the level shifter is provided at the second current electrode of the second load transistor; first and second coupling transistors, each of the first and second coupling transistors having a first current electrode, the first current electrode of the first coupling transistor coupled to the second current electrode of the first load transistor, and the first current electrode of the second coupling transistor coupled to the second current electrode of the second load transistor, the first and second coupling transistors each having a control electrode coupled to receive a variable bias voltage; and first and second input transistors, each of the first and second input transistors having a first current electrode, the first current electrode of the first input transistor coupled to the second current electrode of the first coupling transistor, the first current electrode of the second input transistor coupled to the second current electrode of the second coupling transistor, and a control electrode of each of the first and second input transistors coupled to receive one of first and second differential input signals provided at a second power supply voltage, the second power supply voltage being lower than the first power supply voltage. The first and second load transistors may be coupled together to form a current mirror. The level shifter may further include a bias voltage generator for providing the variable bias voltage, a voltage level of the variable bias voltage determined by a measured duty cycle of the output signal. The level shifter may further include a bias voltage generator controller, the bias voltage generator controller having an input coupled to receive the output signal, and an output coupled to the bias voltage generator, the bias voltage generator controller configured to determine the duty cycle of the output signal based on a comparison of a first counter value to a second counter value, and as a result of the comparison, selecting a voltage level of the variable bias voltage to adjust the duty cycle to be a predetermined duty cycle. The predetermined duty cycle may be fifty percent. The bias voltage generator may include: a voltage regulator having an input coupled to receive a reference voltage, and an output; and a voltage divider having an input coupled to the output of the voltage regulator, and a plurality of taps, one of the plurality of taps coupled to the control electrodes of the first and second coupling transistors in response to a bias voltage select signal. The voltage regulator may comprise an operational amplifier having a first input for receiving the reference voltage, a second input, and an output coupled to the second input, the output for providing a regulated voltage. The level shifter may further include a startup transistor having a first current electrode coupled to receive the first power supply voltage, a second current electrode coupled to the second current electrode of the second load transistor, and a control electrode coupled to receive a control signal. A gate oxide thickness of the first and second load transistors and the first and second coupling transistors may be thicker than a gate oxide thickness of the first and second input transistors. The first and second load transistors may be characterized as being P-channel transistors, the first and second coupling transistors and the first and second input transistors may be characterized as being N-channel transistors.

In another embodiment, there is provided, a level shifter including: a current mirror comprising first and second transistors coupled to receive a first power supply voltage; first and second coupling transistors, each of the first and second coupling transistors having a first current electrode coupled to the current mirror and each of the first and second coupling transistors having a second current electrode, and the first and second coupling transistors each having a control electrode coupled to receive a variable bias voltage, wherein the second current electrode of the second coupling transistor provides an output signal of the level shifter; a startup transistor having a first current electrode coupled to receive the first power supply voltage, a second current electrode of the startup transistor coupled to the first current electrode of the second coupling transistor, and a control electrode coupled to receive a control signal; and first and second input transistors, each of the first and second input transistors having a first current electrode, the first current electrode of the first input transistor coupled to the second current electrode of the first coupling transistor, the first current electrode of the second input transistor coupled to the second current electrode of the second coupling transistor, and a control electrode of each of the first and second input transistors coupled to receive one of first and second differential input signals provided at a second power supply voltage, the second power supply voltage being a lower voltage than the first power supply voltage. The level shifter may further include a bias voltage generator for providing the variable bias voltage, a voltage level of the variable bias voltage determined by a measured duty cycle of the output signal. The level shifter may further include a bias voltage generator controller, the bias voltage generator controller having an input coupled to the receive the output signal, and an output coupled to the bias voltage generator, the bias voltage generator controller configured to determine the duty cycle of the output signal based on a comparison of a first counter value to a second counter value, and as a result of the comparison, selecting a voltage level of the variable bias voltage. The predetermined duty cycle may be fifty percent. The bias voltage generator may include: a voltage regulator having an input coupled to receive a reference voltage, and an output; and a voltage divider having an input coupled to the output of the voltage regulator, and a plurality of taps, one of the plurality of taps coupled to the control electrodes of the first and second coupling transistors in response to a bias voltage select signal from the bias voltage generator controller.

In yet another embodiment, there is provided, a level shifter including: a level shifting circuit configured to level shift differential input signals at a first voltage level to be a level shifted output signal at a second voltage level, the second voltage level being higher than the first voltage level, and the output signal having a duty cycle, wherein the level shifting circuit comprising a current mirror, an input circuit for receiving the differential input signals, and a coupling circuit for coupling the current mirror to the input circuit in response to a variable bias voltage; a variable bias voltage generator configured to provide the variable bias voltage at one of a plurality of voltage levels in response to receiving a select signal; and a bias voltage generator controller configured to provide the select signal to select the voltage level from the plurality of voltage levels in response to measuring the duty cycle of the output signal, wherein the bias voltage generator controller maintains the duty cycle of the output signal at a predetermined duty cycle. The level shifting circuit may comprise: a first transistor having a first current electrode coupled to receive a first power supply voltage at the second voltage level, a second current electrode, and a gate electrode coupled to the second current electrode; a second transistor having a first current electrode coupled to receive the first power supply voltage, a second current electrode, and a control electrode coupled to the gate electrode of the first transistor; a third transistor having a first current electrode coupled to the second current electrode of the first transistor, a second current electrode, and a gate electrode coupled to receive a variable bias voltage; a fourth transistor having a first current electrode coupled to the second current electrode of the second transistor, a second current electrode, and a gate electrode coupled to receive the variable bias voltage; a fifth transistor having a first current electrode coupled to the second current electrode of the third transistor, a second current electrode coupled to ground, and a gate electrode coupled to receive a first input signal of the differential input signals; and a sixth transistor having a first current electrode coupled to the second current electrode of the fourth transistor, a second current electrode coupled to ground, and a gate electrode coupled to receive a second input signal of the differential input signals. The first, second, third, and fourth transistors may have a gate oxide having a first thickness, and the fifth and sixth transistors may have a gate oxide of a second thickness, wherein the second thickness is thinner than the first thickness. The predetermined duty cycle may be fifty percent. The bias voltage generator may include: a voltage regulator having an input coupled to receive a reference voltage, and an output; and a voltage divider having an input coupled to the output of the voltage regulator, and a plurality of taps, one of the plurality of taps coupled to the control electrodes of the first and second coupling transistors in response to a bias voltage select signal.

Figure 3:
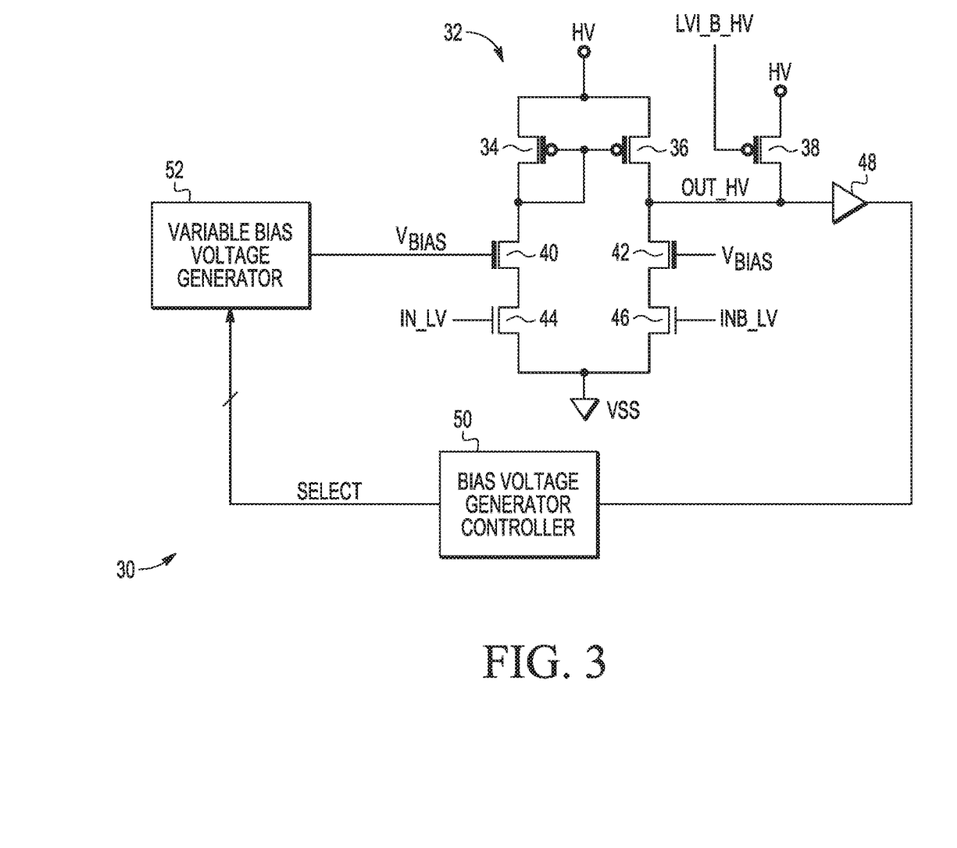
FIG. 3 illustrates, in partial schematic diagram form and partial block diagram form, a level shifter in accordance with an embodiment.

FIG. 3 illustrates, in partial schematic diagram form and partial block diagram form, level shifter 30 in accordance with an embodiment. In one embodiment, level shifter 30 is implemented on an IC using a conventional complementary metal-oxide semiconductor (CMOS) process. In other embodiments, level shifter 30 may be partially or wholly implemented on a single IC using one or more other technologies. Level shifter 30 includes level shifting circuit 32, buffer 48, bias voltage generator controller 50, and variable bias voltage generator 52. Level shifting circuit 32 includes P-channel transistors 34, 36, and 38, and N-channel transistors 40, 42, 44, and 46. In one embodiment, the transistors may be characterized being as finfet transistors. In another embodiment, the transistors may be implemented using any transistor type. Level shifter 30 is intended to function at clock frequencies equal to or higher than approximately one giga Hertz (gHz).

In level shifting circuit 32, P-channel transistor 34 has a source (current electrode) connected to a power supply voltage terminal for receiving a high power supply voltage labeled "HV", a drain (current electrode), and a gate (control electrode) connected to the drain. P-channel transistor 36 has a source connected to receive the power supply voltage HV, a drain for providing an output signal labeled OUT_HV, and a gate connected to the gate and drain of P-channel transistor 34. N-channel transistor 40 has a drain connected to the drain of P-channel transistor 34, a gate for receiving a variable bias voltage labeled VBIAS, and a source. N-channel transistor 42 has a drain connected to the drain of P-channel transistor 36, a gate for receiving variable bias voltage VBIAS, and a source. N-channel transistor 44 has a drain connected to the source of N-channel transistor 40, a gate for receiving an input signal labeled "IN_LV", and source connected to a power supply voltage terminal for receiving a power supply voltage labeled "VSS". N-channel transistor 46 has a drain connected to the source of N-channel transistor 42, a gate connected to receive an input signal labeled "INB_LV", and a source connected to receive VSS. P-channel transistor 38 has a source connected to receive power supply voltage HV, a gate connected to receive a control signal labeled "LVI_B_HV", and a drain connected to the drains of P-channel transistor 36 and N-channel transistor 42. A buffer circuit 46 has an input connected to the drains of transistors 36, 38, and 42, and an output to provide a buffered output signal.

Many IC manufacturing process technologies provide transistors that can be implemented with gate oxides, or gate dielectrics, having several different thicknesses. Transistors implemented with the thicker gate oxides may be useful for circuits that may operate at higher voltages that may cause damage to thinner gate oxides. In FIG. 3, the gate electrodes for transistors having a thicker gate oxide are illustrated with a thicker line than the transistors having a thinner gate oxide. That is, in FIG. 3, P-channel transistors 34, 36, and 38 and N-channel transistors 40 and 42 have a thicker gate oxide than N-channel transistors 44 and 46.

Level shifter 30 functions to level shift the differential signals IN_LV and INB_LV, generated by internal circuitry (not shown) on an IC powered by a power supply at a voltage level LV, to output a corresponding signal OUT_HV to other circuitry (not shown) powered by the power supply having the voltage level HV. The internal circuitry may be, for example, a processor core, memory, or other type of circuitry operating at the voltage level LV that has to communicate with other circuitry operating at the higher voltage level HV. Signals in FIG. 3 are provided at one of voltage level HV or voltage level LV, as indicated by the signal name. By way of example, voltage level LV may be +0.8 volts and voltage level HV may be +1.8 volts with VSS being ground. In other embodiments, the voltage levels may be different.

As provided in FIG. 3, P-channel transistors 34 and 36 are connected together to form a current mirror. In other embodiments, P-channel transistors 34 and 36 may be connected together differently. For example, in another embodiment, the gate of P-channel transistor 34 may be connected to the drain of P-channel transistor 36 and the gate of P-channel transistor 36 may be connected to the drain of P-channel transistor 34.

N-channel transistors 40 and 42 provide a tunable connection between the current mirror transistors 34 and 36 and N-channel transistors 44 and 46 in response to variable bias voltage VBIAS. N-channel transistors 44 and 46 receive differential input signals IN_LV and INB_LV, where input signal INB_LV is a logical complement of input signal IN_LV as indicated by the "B" in the signal name. P-channel transistor 38 ensures that output signal OUT-HV starts at a known state during power-up of the IC. For example, when a power supply voltage is applied, bias voltage VBIAS is low, causing N-channel transistors 40 and 42 to be off, or non-conductive. The active low control signal LVI_B_HV will be low initially, causing P-channel transistor 38 to be on, or conductive. As the power supply voltage increases during start-up, output signal OUT_HV will be pulled to a logic high by P-channel transistor 38. During normal operation, differential input signals IN_LV and INB_LV are provided to level shifter 30. As the differential signal periodically changes logic states, N-channel transistors 44 and 46 are alternately conductive and non-conductive and the input signals change logic states. When transistor 46 is conductive, the voltage of output signal OUT_HV decreases, and when transistor 46 is non-conductive, the voltage of OUT_HV increases. The current mirror generates a current to each of transistors 40 and 42. The voltage level of the variable bias voltage VBIAS determines the conductivity of transistors 40 and 42 and thus determines how quickly OUT-HV transitions from one logic state to the other. For example, a relatively higher bias voltage VBIAS results in transistors 40 and 42 being more conductive, thus causing transistors 34 and 36 to be more conductive so the voltage of output signal OUT_HV is pulled high more quickly than for a relatively lower bias voltage VBIAS. During one clock cycle, this causes the logic high time to be more than the logic low time for output signal OUT_HV, thus increasing the duty cycle of OUT_HV. Conversely, a relatively lower bias voltage VBIAS causes transistors 34 and 36 to be less conductive, causing falling transitions of OUT_HV to occur more quickly than rising transitions, thus decreasing the duty cycle of output signal OUT_HV.

Output signal OUT_HV is a time-varying signal. As process, voltage, and temperature vary, the duty cycle of output signal OUT_HV may vary. For example, a changing process corner may cause a duty cycle of output signal OUT_HV to change. Bias voltage generator controller 50 has an input connected to the output of buffer 48, and an output for providing a select signal labeled "SELECT". In the illustrated embodiment, select signal SELECT is a digital signal having one or more bits as indicated by the hash mark through the SELECT line. Variable bias voltage generator 52 has an input connected to receive the select signal SELECT, and an output for providing variable bias voltage VBIAS to the gates of coupling N-channel transistors 40 and 42. Variable bias voltage generator controller 50 measures the duty cycle of output signal OUT_HV, and in response, provides select signal SELECT to adjust the level of bias voltage VBIAS. Bias voltage VBIAS is provided at a voltage level that will set the conductivity of coupling transistors 40 and 42 to adjust the duty cycle of level shifter 30 to a predetermined duty cycle, for example, fifty percent (50%). In another embodiment, the predetermined duty cycle can be different. For example, the duty cycle may be set to 40% by a user, and controller 50 would ensure the duty cycle of the output signal is 40% across PVT.

Bias voltage VBIAS is adjusted in response to PVT changes. By varying the bias voltage, level shifter 30 provides output signal OUT_HV with a relatively constant duty cycle for changing PVT. For example, a lower bias voltage may be provided to compensate for a lower threshold voltage caused by a fast process corner. Also, for example, a higher bias voltage may be provided when the process corner is slow.

Figure 4:
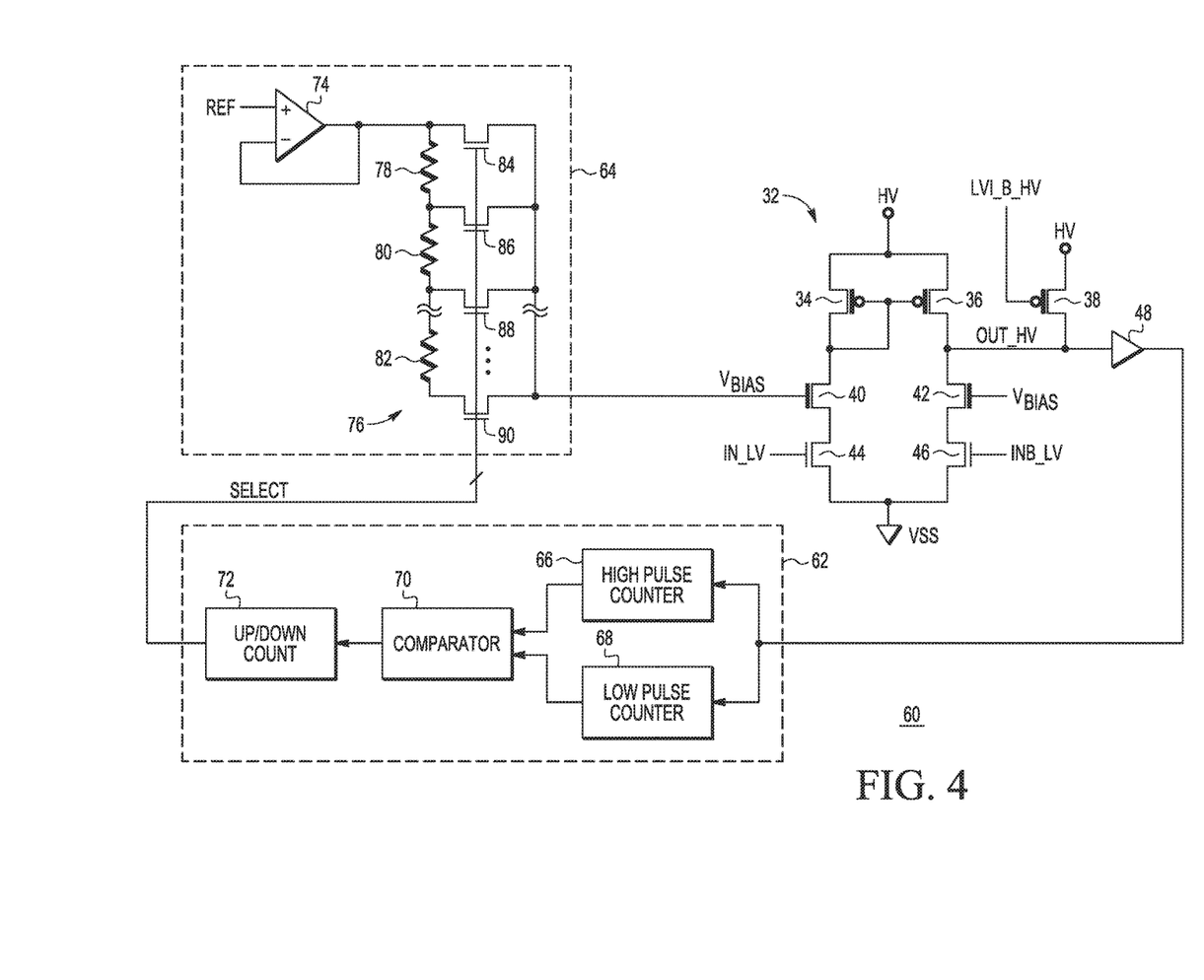
FIG. 4 illustrates, in partial schematic diagram form and partial block diagram form, a level shifter in accordance with another embodiment.

FIG. 4 illustrates, in partial schematic diagram form and partial block diagram form, level shifter 60 in accordance with another embodiment. Level shifter 60 includes level shifting circuit 32, buffer 48, bias voltage generator controller 62, and variable bias voltage generator 64. Level shifting circuit 32 and buffer 48 are the same as described above in the discussion of FIG. 3. Bias voltage generator controller 62 includes counters 66 and 68, comparator 70, and up/down counter 72. Bias voltage generator 64 includes operational amplifier 74 and voltage divider 76. Voltage divider 76 includes a plurality of resistors including resistors 78, 80, and 82 and a plurality of N-transistors including transistors 84, 86, 88, and 90. The plurality of resistors are connected together in series. Nodes, or taps between adjacent resistors are coupled to corresponding transistors of the plurality of transistors. Each of the plurality of transistors connects a node, or tap, to the gates of N-channel transistors 40 and 42 in response to the select signal SELECT. In the illustrated embodiment, only one tap is connected to the gates of transistors 40 and 42 at one time. Amplifier 74 is coupled to provide a regulated voltage to one end of the series-connected resistors. Amplifier 74 has a first input labeled with a plus sign (+) for receiving a reference voltage labeled REF, and a second input labeled with a minus sign (−) connected to receive feedback from the output of amplifier 74. The voltage level of VBIAS is the voltage at the output of amplifier 74 minus the voltage drop across one or more of the voltage divider resistors depending on which of transistors 84, 86, 88, and 90 is conductive. Bias voltage generator controller 62 may be implemented differently in other embodiments.

During operation, a buffered output signal OUT_HV is provided to inputs of counters 66 and 68 of bias voltage generator controller 62. Controller 62 performs detection and measurement of the duty cycle of output signal OUT_HV, and generating a select signal based on the outcome of a comparison. In one embodiment, the measurement of the high and low pulses may be accomplished using unit delay elements (not shown). Counter 66 is periodically incremented during the time when output signal OUT_HV is a logic high. Counter 68 is periodically incremented during the time when output signal OUT_HV is a logic low. After counting the high and low periods for a clock cycle, the counter values are provided to inputs of comparator 70. Comparator 70 compares the counter values to determine the duty cycle. For example, if the counter values from counters 66 and 68 are equal, then the duty cycle is fifty percent. If the value of counter 66 is higher than the value of counter 68, then the high period of the clock cycle is longer than the low period and the duty cycle is higher than 50%. The result of the comparison is provided to up/down count 72 to indicate to up/down counter 72 whether the value of select signal SELECT should be increased, decreased, or stay the same. The select signal SELECT causes one of the plurality of transistors 84, 86, 88, or 90 to be conductive to provide bias voltage VBIAS at one of a plurality of predetermined voltage levels. The number of predetermined voltage levels determines the number of bits of select signal SELECT.

Level shifters 30 and 60 thus provide a controllable bias voltage to generate a higher bias for e.g., slow process corners and a lower bias for fast process corners. The bias voltage generator controller automatically detects the correct setting depending on how the PVT conditions affect output signal OUT_HV.

Figure 5:
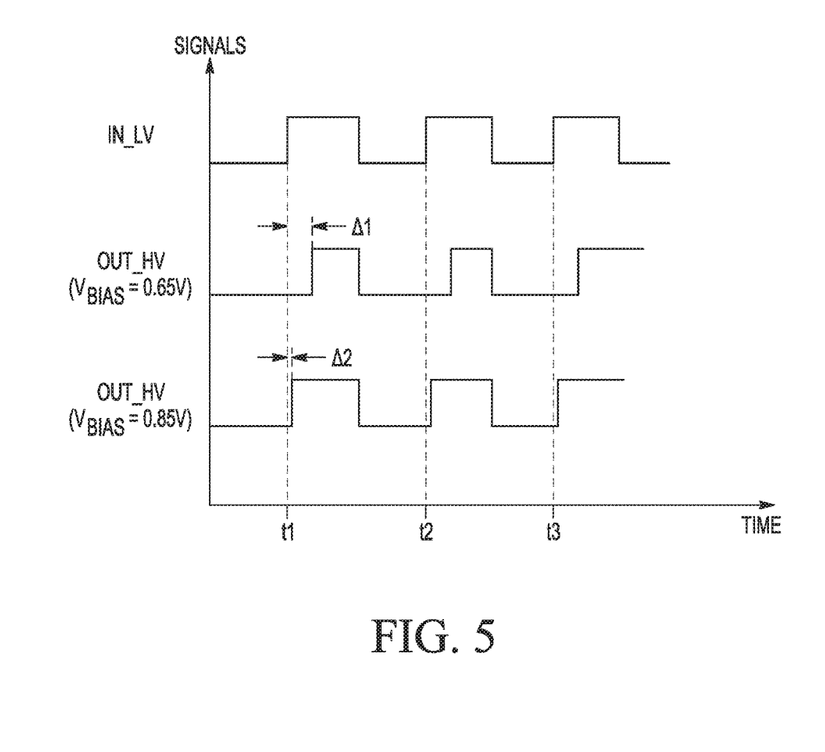
FIG. 5 illustrates a timing diagram of various signals of the embodiments of FIG. 3 and FIG. 4.

FIG. 5 illustrates a timing diagram of various signals of the embodiments of FIG. 3 and FIG. 4. One clock cycle of input signal IN_LV is illustrated between times t1 and t2 and again between times t2 and t3. At time t1, a bias voltage VBIAS equal to 0.65 volts may result in the rising edge of output signal OUT_HV trailing the rising edge of input signal IN_LV by a time Δ1. In comparison, changing the bias voltage VBIAS to equal 0.85 volts increases the current through transistors 40 and 42 so that the rising edge of OUT_HV at time t1 occurs more quickly and the time difference between the rising edges of IN_LV and OUT_HV is Δ2, where Δ2 is less than Δ1.

Various embodiments, or portions of the embodiments, may be implemented in hardware or as instructions on a non-transitory machine-readable storage medium including any mechanism for storing information in a form readable by a machine, such as a personal computer, laptop computer, file server, smart phone, or other computing device. The non-transitory machine-readable storage medium may include volatile and non-volatile memories such as read only memory (ROM), random access memory (RAM), magnetic disk storage media, optical storage medium, flash memory, and the like. The non-transitory machine-readable storage medium excludes transitory signals.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A level shifter comprising:
   first and second load transistors, each of the first and second load transistors having a first current electrode coupled to receive a first power supply voltage, and each of the first and second load transistors having a second current electrode, wherein an output signal of the level shifter is provided at the second current electrode of the second load transistor;
   first and second coupling transistors, each of the first and second coupling transistors having a first current electrode, the first current electrode of the first coupling transistor coupled to the second current electrode of the first load transistor, and the first current electrode of the second coupling transistor coupled to the second current electrode of the second load transistor, the first and second coupling transistors each having a control electrode coupled to receive a variable bias voltage;
   first and second input transistors, each of the first and second input transistors having a first current electrode, the first current electrode of the first input transistor coupled to the second current electrode of the first coupling transistor, the first current electrode of the second input transistor coupled to the second current electrode of the second coupling transistor, and a control electrode of each of the first and second input transistors coupled to receive one of first and second differential input signals provided at a second power supply voltage, the second power supply voltage being lower than the first power supply voltage; and
   a bias voltage generator for providing the variable bias voltage, a voltage level of the variable bias voltage determined by a measured duty cycle of the output signal.

2. The level shifter of claim 1, wherein the first and second load transistors are coupled together to form a current mirror.

3. The level shifter of claim 1, further comprising a bias voltage generator controller, the bias voltage generator controller having an input coupled to receive the output signal, and an output coupled to the bias voltage generator, the bias voltage generator controller configured to determine the duty cycle of the output signal based on a comparison of a first counter value to a second counter value, and as a result of the comparison, selecting a voltage level of the variable bias voltage to adjust the duty cycle to be a predetermined duty cycle.

4. The level shifter of claim 3, wherein the predetermined duty cycle is fifty percent.

5. The level shifter of claim 1, wherein the bias voltage generator comprises:
   a voltage regulator having an input coupled to receive a reference voltage, and an output; and
   a voltage divider having an input coupled to the output of the voltage regulator, and a plurality of taps, one of the plurality of taps coupled to the control electrodes of the first and second coupling transistors in response to a bias voltage select signal.

6. The level shifter of claim 5, wherein the voltage regulator comprises an operational amplifier having a first input for receiving the reference voltage, a second input, and an output coupled to the second input, the output for providing a regulated voltage.

7. The level shifter of claim 1, further comprising a startup transistor having a first current electrode coupled to receive the first power supply voltage, a second current electrode coupled to the second current electrode of the second load transistor, and a control electrode coupled to receive a control signal.

8. The level shifter of claim 1, wherein a gate oxide thickness of the first and second load transistors and the first and second coupling transistors is thicker than a gate oxide thickness of the first and second input transistors.

9. The level shifter of claim 1, wherein the first and second load transistors are characterized as being P-channel transistors, the first and second coupling transistors and the first and second input transistors are characterized as being N-channel transistors.

10. A level shifter comprising:
   a current mirror comprising first and second transistors coupled to receive a first power supply voltage;
   first and second coupling transistors, each of the first and second coupling transistors having a first current electrode coupled to the current mirror and each of the first and second coupling transistors having a second current electrode, and the first and second coupling transistors each having a control electrode coupled to receive a variable bias voltage, wherein the second current electrode of the second coupling transistor provides an output signal of the level shifter;
   a startup transistor having a first current electrode coupled to receive the first power supply voltage, a second current electrode of the startup transistor coupled to the first current electrode of the second coupling transistor, and a control electrode coupled to receive a control signal; and first and second input transistors, each of the first and second input transistors having a first current electrode, the first current electrode of the first input transistor coupled to the second current electrode of the first coupling transistor, the first current electrode of the second input transistor coupled to the second current electrode of the second coupling transistor, and a control electrode of each of the first and second input transistors coupled to receive one of first and second differential input signals provided at a second power supply voltage, the second power supply voltage being a lower voltage than the first power supply voltage.

11. The level shifter of claim 10, further comprising a bias voltage generator for providing the variable bias voltage, a voltage level of the variable bias voltage determined by a measured duty cycle of the output signal.

12. The level shifter of claim 11, further comprising a bias voltage generator controller, the bias voltage generator controller having an input coupled to the receive the output signal, and an output coupled to the bias voltage generator, the bias voltage generator controller configured to determine the duty cycle of the output signal based on a comparison of a first counter value to a second counter value, and as a result of the comparison, selecting a voltage level of the variable bias voltage.

13. The level shifter of claim 12, wherein the predetermined duty cycle is fifty percent.

14. The level shifter of claim 12, wherein the bias voltage generator comprises:
 a voltage regulator having an input coupled to receive a reference voltage, and an output; and
 a voltage divider having an input coupled to the output of the voltage regulator, and a plurality of taps, one of the plurality of taps coupled to the control electrodes of the first and second coupling transistors in response to a bias voltage select signal from the bias voltage generator controller.

15. A level shifter comprising:
 a level shifting circuit configured to level shift differential input signals at a first voltage level to be a level shifted output signal at a second voltage level, the second voltage level being higher than the first voltage level, and the output signal having a duty cycle, wherein the level shifting circuit comprising a current mirror, an input circuit for receiving the differential input signals, and a coupling circuit for coupling the current mirror to the input circuit in response to a variable bias voltage;
 a variable bias voltage generator configured to provide the variable bias voltage at one of a plurality of voltage levels in response to receiving a select signal; and a bias voltage generator controller configured to provide the select signal to select the voltage level from the plurality of voltage levels in response to measuring the duty cycle of the output signal, wherein the bias voltage generator controller maintains the duty cycle of the output signal at a predetermined duty cycle.

16. The level shifter of claim 15, wherein the level shifting circuit comprises:
 a first transistor having a first current electrode coupled to receive a first power supply voltage at the second voltage level, a second current electrode, and a gate electrode coupled to the second current electrode;
 a second transistor having a first current electrode coupled to receive the first power supply voltage, a second current electrode, and a control electrode coupled to the gate electrode of the first transistor;
 a third transistor having a first current electrode coupled to the second current electrode of the first transistor, a second current electrode, and a gate electrode coupled to receive a variable bias voltage;
 a fourth transistor having a first current electrode coupled to the second current electrode of the second transistor, a second current electrode, and a gate electrode coupled to receive the variable bias voltage;
 a fifth transistor having a first current electrode coupled to the second current electrode of the third transistor, a second current electrode coupled to ground, and a gate electrode coupled to receive a first input signal of the differential input signals; and
 a sixth transistor having a first current electrode coupled to the second current electrode of the fourth transistor, a second current electrode coupled to ground, and a gate electrode coupled to receive a second input signal of the differential input signals.

17. The level shifter of claim 15, wherein the first, second, third, and fourth transistors have a gate oxide having a first thickness, and the fifth and sixth transistors have a gate oxide of a second thickness, wherein the second thickness is thinner than the first thickness.

18. The level shifter of claim 15, wherein the predetermined duty cycle is fifty percent.

19. The level shifter of claim 15, wherein the bias voltage generator comprises:
 a voltage regulator having an input coupled to receive a reference voltage, and an output; and
 a voltage divider having an input coupled to the output of the voltage regulator, and a plurality of taps, one of the plurality of taps coupled to the control electrodes of the first and second coupling transistors in response to a bias voltage select signal.

* * * * *